US012696568B2

(12) United States Patent
Lee et al.

(10) Patent No.: US 12,696,568 B2
(45) Date of Patent: Jul. 28, 2026

(54) IMAGE SENSING DEVICE AND METHOD OF IMAGE SIGNAL PROCESSING

(71) Applicant: SAMSUNG ELECTRONICS CO., LTD., Suwon-si (KR)

(72) Inventors: Tae Yon Lee, Suwon-si (KR); Ji Hyun Kwak, Suwon-si (KR); Gyu Seok Lee, Suwon-si (KR); Su Rim Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/364,701

(22) Filed: Aug. 3, 2023

(65) Prior Publication Data

US 2024/0186349 A1     Jun. 6, 2024

(30) Foreign Application Priority Data

Dec. 1, 2022     (KR) ........................ 10-2022-0165606

(51) Int. Cl.
H10F 39/00 (2025.01)
H04N 25/13 (2023.01)

(52) U.S. Cl.
CPC ....... H10F 39/8063 (2025.01); H04N 25/134 (2023.01); H10F 39/8053 (2025.01)

(58) Field of Classification Search
CPC ............ H10F 39/8063; H10F 39/8053; H04N 25/134; H04N 25/131; H04N 23/88; H04N 1/6077; H04N 9/3182; H04N 23/12; H04N 23/54; H04N 23/55; H04N 25/133; H04N 25/135; H04N 23/84; H04N 23/843; H04N 23/10; H04N 23/11
See application file for complete search history.

(56) References Cited

U.S. PATENT DOCUMENTS

| | | | | | |
|---|---|---|---|---|---|
| 6,275,261 | B1 * | 8/2001 | Yamazaki | ............ | H04N 25/136 348/E9.01 |
| 6,967,748 | B1 * | 11/2005 | Takarada | ............. | H04N 23/843 358/1.9 |
| 8,345,132 | B2 * | 1/2013 | Tai | ....................... | H04N 25/134 348/222.1 |
| 8,981,278 | B2 | 3/2015 | Toda et al. | | |
| 9,595,556 | B2 | 3/2017 | Ahn et al. | | |

(Continued)

FOREIGN PATENT DOCUMENTS

JP     5396913     1/2014

*Primary Examiner* — Michael S Osinski
(74) *Attorney, Agent, or Firm* — MORGAN, LEWIS & BOCKIUS LLP

(57) ABSTRACT

An image sensing device and a method of image signal processing are provided. The image sensing device includes a lens module, a microlens below the lens module, an image sensor below the microlens and which includes a first pixel having a cyan color filter, and which outputs a first image signal, a second pixel having a magenta color filter, and which outputs a second image signal, a third pixel having a yellow color filter, and which outputs a third image signal, and a fourth pixel which outputs a fourth image signal, and an image signal processor which receives image signals of the image sensor, and extracts a red (R) data component, green (G) data component, blue (B) data component, and near-infrared (IR) data component of the light from the image signals.

17 Claims, 16 Drawing Sheets

(56)     References Cited

U.S. PATENT DOCUMENTS

| | | | | |
|---|---|---|---|---|
| 10,593,717 | B2 | 3/2020 | Tadano | |
| 10,638,060 | B2 | 4/2020 | Liu et al. | |
| 11,178,372 | B1 * | 11/2021 | Jang | H04N 23/815 |
| 11,368,617 | B2 | 6/2022 | Zhou et al. | |
| 11,381,788 | B2 | 7/2022 | Onishi | |
| 2004/0251404 | A1 * | 12/2004 | Duijve | G01J 3/51 |
| | | | | 250/226 |
| 2005/0129309 | A1 * | 6/2005 | Kang | H04N 1/52 |
| | | | | 382/167 |
| 2005/0285968 | A1 * | 12/2005 | Sugimori | H04N 23/843 |
| | | | | 348/E9.01 |
| 2006/0176314 | A1 * | 8/2006 | Shiohara | G06T 11/001 |
| | | | | 345/604 |
| 2007/0045517 | A1 * | 3/2007 | Fukuyoshi | H10F 77/413 |
| | | | | 257/E31.127 |
| 2009/0091647 | A1 * | 4/2009 | Hiromichi | H04N 25/134 |
| | | | | 348/294 |
| 2010/0128149 | A1 * | 5/2010 | Kim | H04N 25/133 |
| | | | | 348/E9.037 |
| 2012/0025080 | A1 * | 2/2012 | Liu | H04N 23/88 |
| | | | | 250/332 |
| 2013/0153748 | A1 * | 6/2013 | Suzuki | H04N 25/136 |
| | | | | 250/208.1 |
| 2014/0138519 | A1 * | 5/2014 | Wang | G01S 17/894 |
| | | | | 250/206.1 |
| 2015/0221691 | A1 * | 8/2015 | Watanabe | H04N 25/135 |
| | | | | 257/432 |
| 2016/0057367 | A1 | 2/2016 | Lee | |
| 2017/0263662 | A1 * | 9/2017 | Hsieh | H10F 39/806 |
| 2018/0182812 | A1 * | 6/2018 | Heo | H10F 39/026 |
| 2019/0088693 | A1 * | 3/2019 | Kato | H10F 39/182 |
| 2019/0346599 | A1 * | 11/2019 | Komai | H04N 25/134 |
| 2022/0239881 | A1 | 7/2022 | Cheng et al. | |
| 2022/0318955 | A1 * | 10/2022 | Min | G06T 5/92 |
| 2022/0384507 | A1 * | 12/2022 | Park | H10F 39/18 |
| 2023/0049248 | A1 * | 2/2023 | Liu | H04N 5/265 |
| 2023/0351977 | A1 * | 11/2023 | Crounse | G09G 3/344 |
| 2024/0163574 | A1 * | 5/2024 | Watanabe | H04N 23/12 |
| 2024/0214699 | A1 * | 6/2024 | Kim | H10F 39/8057 |

* cited by examiner

<u>1</u>

900

IMAGE SENSING DEVICE AND METHOD OF IMAGE SIGNAL PROCESSING

CROSS-REFERENCE TO RELATED APPLICATION

This application claims priority under 35 U.S.C. § 119 to Korean Patent Application No. 10-2022-0165606, filed on Dec. 1, 2022, in the Korean Intellectual Property Office, the disclosure of which is herein incorporated by reference in its entirety.

BACKGROUND

1. Technical Field

Embodiments of the present disclosure relates to an image sensing device and a method of processing the image signal.

2. Discussion of Related Art

An image sensing device may be manufactured using a semiconductor element that converts optical information into an electric signal. Such an image sensing device may include a charge coupled device (CCD) image sensing device and a complementary metal-oxide semiconductor (CMOS) image sensing device.

In recent years, the demand for image sensors with improved performance has increased with the development of computer and communication industries. These image sensors have been used in various fields and for different devices. For example, image sensors maybe found in digital cameras, camcorders, smartphones, game consoles, security cameras, medical micro cameras, and robots.

SUMMARY

Aspects of the present invention provide an image sensing device having improved performance.

Aspects of the present invention also provide a method of processing an image signal having improved performance.

Aspects of the present invention are not restricted to those set forth herein. The above and other aspects of the present invention will become more apparent to one of ordinary skill in the art to which the present invention pertains by referencing the detailed description of the present invention given below.

According to some aspects of the present disclosure, there is provided an image sensing device comprises a lens module, a microlens below the lens module, an image sensor below the microlens and comprising a first pixel having a cyan color filter and which receives light through the lens module and outputs a first image signal, a second pixel having a magenta color filter and which receives light through the lens module and outputs a second image signal, a third pixel having a yellow color filter and which receives light through the lens module and outputs a third image signal, and a fourth pixel which receives light through the lens module and outputs a fourth image signal, and an image signal processor which receives a plurality of image signals including the first image signal, the second image signal, the third image signal and the fourth image signal, and extracts a red (R) data component, green (G) data component, blue (B) data component, and near-infrared (IR) data component from the plurality of image signals.

According to some aspects of the present disclosure, there is provided an image sensing device comprises an image sensor configured to output, based on a received light, a first image signal including a cyan signal component, a second image signal including a magenta signal component, a third image signal including a yellow signal component, and a fourth image signal including a white signal component, and an image signal processor configured to receive the first image signal, the second image signal, the third image signal, and the fourth image signal from the image sensor, and extract a red (R) data component, a green (G) component, a blue (B) data component, and a near-infrared (IR) data component of the light from the first image signal, the second image signal, the third image signal, and the fourth image signal.

According to some aspects of the present disclosure, there is provided a method of processing an image signal, the method comprising filtering a first light through a lens module to obtain a second light, generating, by an image sensor, a first image signal using a first portion of the second light received through a cyan color filter, generating, by the image sensor, a second image signal using a second portion of the second light received through a magenta color filter, generating, by the image sensor, a third image signal using a third portion of the second light received through a yellow color filter, generating, by the image sensor, a fourth image signal using the second light, and extracting, by an image signal processor, each of a red (R) data component, a green (G) data component, a blue (B) data component, and a near-infrared (IR) data component of the first light from the first image signal, the second image signal, the third image signal, and the fourth image signals.

It should be noted that the effects of the present disclosure are not limited to those described above, and other effects of the present disclosure will be apparent from the following description.

BRIEF DESCRIPTION OF DRAWINGS

The above and other aspects and features of the present disclosure will become apparent and readily appreciated from the following description of embodiments, taken in conjunction with the attached drawings, in which.

DETAILED DESCRIPTION

Hereinafter, embodiments according to the technical concepts of the present invention are described with reference to the accompanying drawings.

Figure 1:
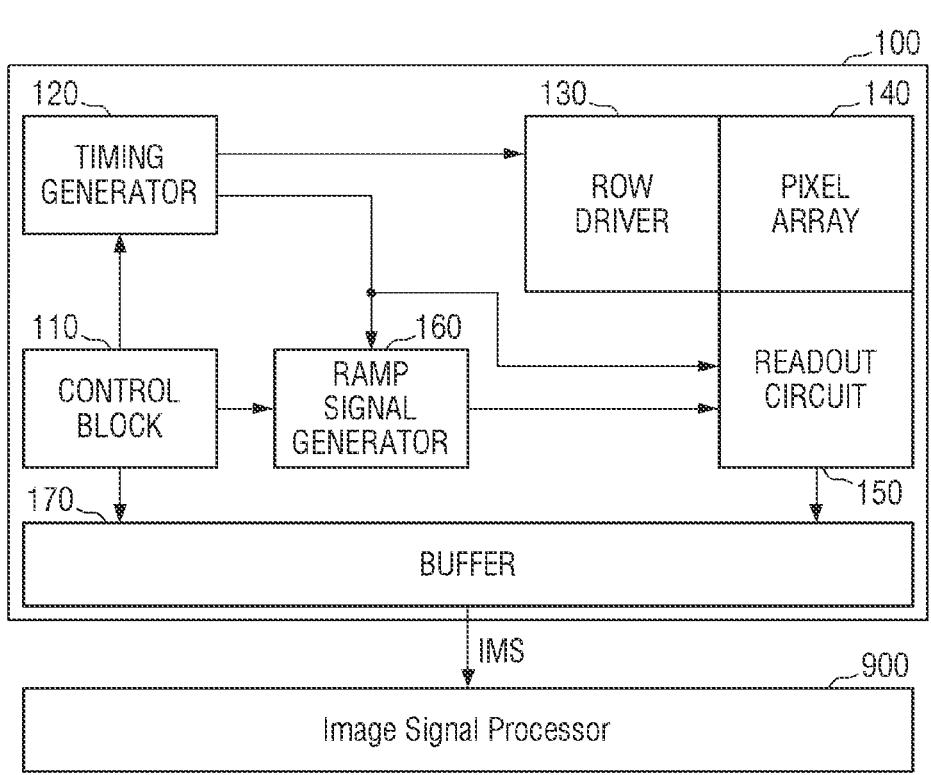
FIG. 1 is a block diagram of an image sensing device according to some embodiments of the present disclosure.

FIG. 1 is a block diagram of an image sensing device according to some embodiments of the present disclosure.

Referring to FIG. 1, the image sensing device 1 may include an image sensor 100 and an image signal processor 900.

Light may carry information about an image. The wavelength of the light carries color information. The image sensor 100 may sense the light and generate an image signal IMS according to the sensed light. In some embodiments, although the generated image signal IMS may be, for example, a digital signal, embodiments are not limited thereto.

The image sensor 100 may include a control register block 110, a timing generator 120, a row driver 130, a pixel array 140, a readout circuit 150, a ramp signal generator 160, and a buffer 170. The image signal IMS may be provided to the image signal processor 900 by the image sensor 100 and processed. The image signal processor 900 receives the image signal IMS that is output from the buffer 170 of the image sensor 100. The image signal processor 900 may process the received image signal IMS to display the image signal IMS.

In some embodiments, the image signal processor 900 may perform digital binning on the image signal IMS that is output from the image sensor 100. Digital binning may include the off-sensor adding or averaging of pixel values. The image signal IMS that is output from the image sensor 100 may be a raw image signal from the pixel array 140 without analog binning, or may be the image signal IMS on which the analog binning has already been performed.

In some embodiments, the image sensor 100 and the image signal processor 900 may be disposed separately from each other as shown. For example, the image sensor 100 may be mounted on a first chip and the image signal processor 900 may be mounted on a second chip, and the first chip and the second chip may communicate with each other through a predetermined interface. Embodiments are not limited thereto, and the image sensor 100 and the image signal processor 900 may be implemented as a single package, for example, a MCP (multi-chip package).

The control register block 110 of the image sensor 100 may control the operation of the image sensor 100. In particular, the control register block 110 may directly transmit an operating signal to the timing generator 120, the ramp signal generator 160, and the buffer 170.

The timing generator 120 may generate a signal that serves as a timing reference signal for one or more of the components of the image sensor 100. The timing reference signal generated by the timing generator 120 may be sent to the row driver 130, the readout circuit 150, the ramp signal generator 160, and the like.

The ramp signal generator 160 may generate and transmit a ramp signal. The ramp signal may be used in the readout circuit 150. For example, the readout circuit 150 may include a correlated double sampler (CDS), a comparator, or the like. The ramp signal generator 160 may generate and transmit the ramp signal that may be used in the correlated double sampler, the comparator, or the like.

The buffer 170 may include, for example, a latch. The buffer 170 may temporarily store the image signal IMS, and may transmit the image signal IMS to an external memory or an external device.

The pixel array 140 may sense an external image in the form of light. The pixel array 140 may include a plurality of pixels (or unit pixels). The row driver 130 may selectively activate one or more rows of the pixel array 140.

The readout circuit 150 may sample the pixel signal provided from the pixel array 140, compare the pixel signal with the ramp signal, and convert an analog image signal (data) into a digital image signal (data) based on the comparison results.

Figure 2:
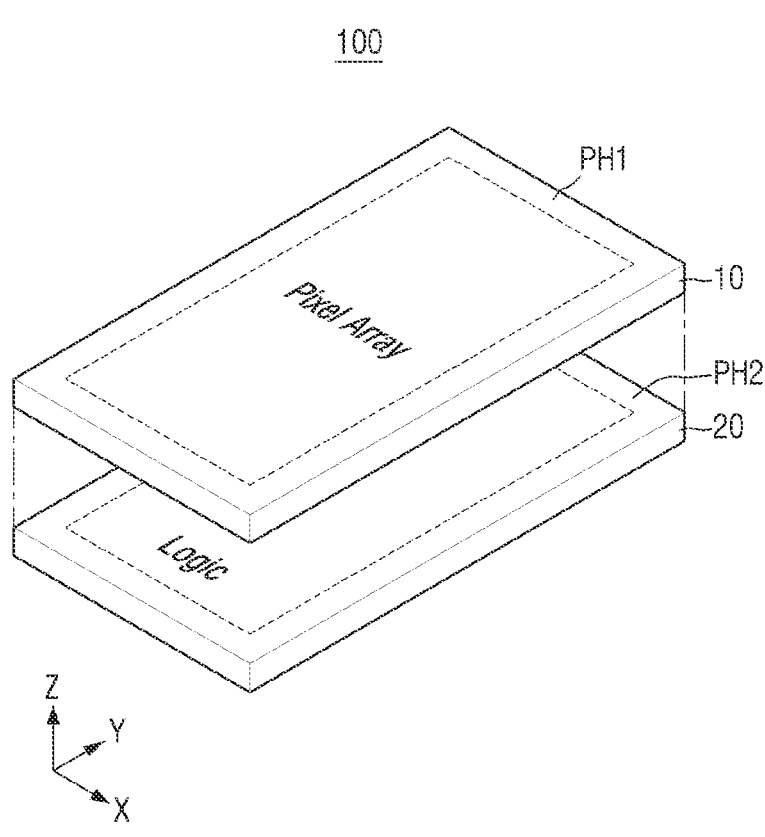
FIG. 2 is a diagram showing a conceptual layout of the image sensor of FIG. 1.

FIG. 2 is a diagram showing a conceptual layout of the image sensor of FIG. 1.

Referring to FIG. 2, the image sensor 100 may include a first region 10 and a second region 20 which are stacked in a third direction Z. The first region 10 and the second region 20 may extend in a first direction X and a second direction Y as shown, and the components shown in FIG. 1 may be disposed in the first region 10 and the second region 20.

Further, although not shown in the drawings, a memory may be disposed below the second region 20 in some embodiments. The memory may include memory elements such as a dynamic random access memory (DRAM) element, a static random access memory (SRAM) element, a spin transfer torque magnetic random access memory (STT-MRAM) element, or a flash memory element. If the memory includes, for example, a DRAM element, it may receive and process the image data at a relatively high speed. Additionally, in some embodiments, the memory may be disposed in the second region 20.

The first region 10 may include a pixel array region (Pixel Array) and a first peripheral region PH1, and the second region 20 may include a logic circuit region (Logic) and a second peripheral region PH2. The first region 10 and the second region 20 may be stacked vertically, for example, with the first region 10 disposed on the second region 20.

In the first region 10, the pixel array region (Pixel Array) may be a region in which the pixel array (pixel array 140 of FIG. 1) is placed. Although not shown in the drawing, the pixel array region (Pixel Array) may include a plurality of unit pixels. The unit pixels may be arranged in a matrix. Each unit pixel may include a photoelectric conversion layer and a transistor. A detailed description of the unit pixel is provided herein.

The first peripheral region PH1 may include a plurality of pads. The plurality of pads may be disposed around the pixel array region (Pixel Array). The plurality of pads may transmit and receive electrical signals to and from an external device, for example.

In the second region 20, the logic circuit region (Logic) may include electronic elements including a plurality of transistors. The electronic elements of the logic circuit region (Logic) may be electrically connected to the pixel array region (Pixel Array). The electronic elements may provide a constant signal to each unit pixel PX of the pixel array region (Pixel Array) or control the output signal.

For example, the control register block 110, the timing generator 120, the row driver 130, the readout circuit 150, the ramp signal generator 160, the buffer 170, and the like described with reference to FIG. 1 may be disposed in the logic circuit region (Logic). For example, blocks other than the pixel array 140 in the blocks of FIG. 1 may be disposed in the logic circuit region (Logic).

Although the second peripheral region PH2 may also be disposed in a region of the second region 20 corresponding to the first peripheral region PH1 of the first region 10, embodiments are not limited thereto.

Figure 3:
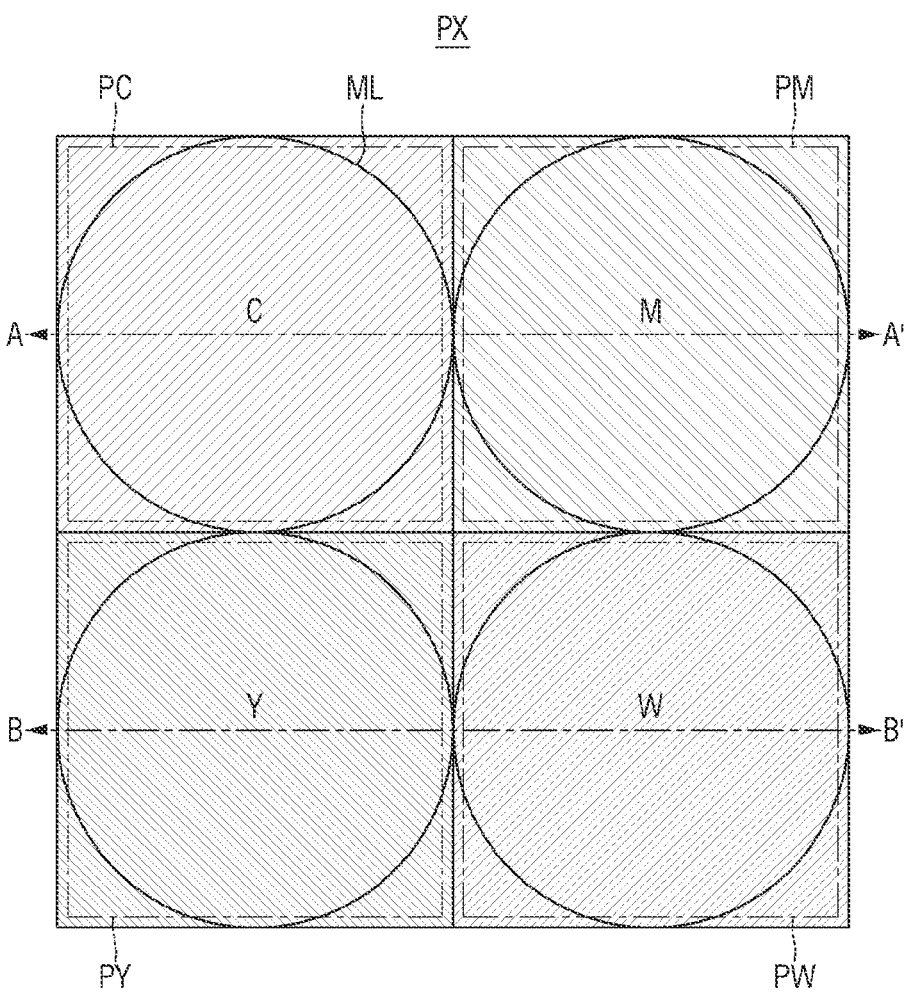
FIG. 3 is a diagram for explaining a unit pixel according to some embodiments of the present disclosure.

FIG. 3 is a diagram for explaining a unit pixel according to some embodiments.

The unit pixel PX according to some embodiments may include a cyan pixel PC, a magenta pixel PM, a yellow pixel PY, and a white pixel PW disposed in a regular pattern, as shown in FIG. 3. The unit pixel PX may include a microlens ML corresponding to each pixel. For example, a first microlens may be disposed on the cyan pixel PC, a second microlens may be disposed on the magenta pixel PM, a third microlens may be disposed on the yellow pixel PY, and a fourth microlens may be disposed on the white pixel PW.

Although not shown in the drawing, in some embodiments, the cyan pixel PC may include a cyan color filter, the magenta pixel PM may include a magenta color filter, and the yellow pixel PY may include a yellow color filter. Furthermore, the white pixels PW may not include a separate color filter.

In addition, the pixel array region (Pixel Array) of FIG. 2 may be a region in which the unit pixels PX of FIG. 3 are arranged in a matrix in the first direction X and the second direction Y.

Figure 4:
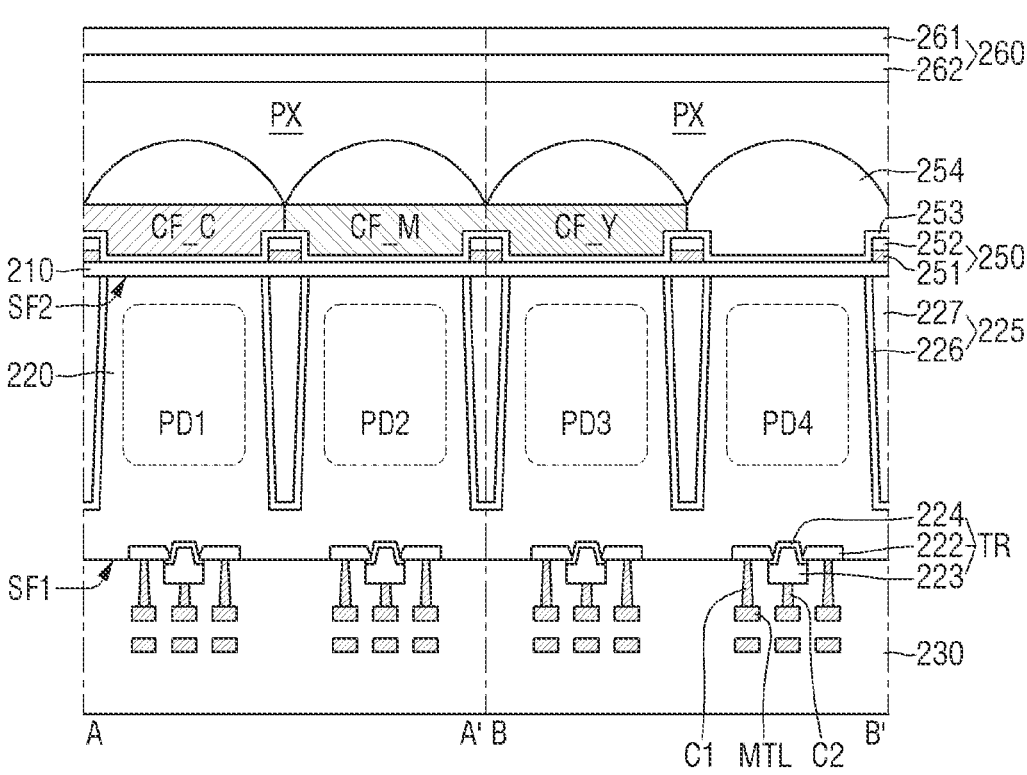
FIG. 4 is a cross-sectional view of a pixel taken along lines A-A' and B-B' of FIG. 3.

FIG. 4 is a cross-sectional view of a unit pixel taken along lines A-A' and B-B' of FIG. 3.

Referring to FIG. 4, a lens module 260 may be disposed on the unit pixel PX. In some embodiments, the lens module 260 is a dual band pass filter. In some embodiments, the lens module 260 may include a first pass filter 261 that transmits light of a near-infrared (IR) range, and a second pass filter 262 that transmits light of a visible light range. Additionally, in some embodiments, the first pass filter 261 may be disposed above the second pass filter 262. For example, the first pass filter 261 may be disposed directly on the second pass filter 262.

Referring to FIG. 3 and FIG. 4, the unit pixel PX may include a cyan pixel PC, a magenta pixel PM, a yellow pixel PY, and a white pixel PW. Since each pixel has a similar structure, the pixels are described below as a general example.

A pixel, such as the cyan pixel PC, may include a semiconductor substrate 220, a first photoelectric conversion layer PD1, a transistor TR, and a pixel isolation pattern 225.

The semiconductor substrate 220 may be a bulk silicon or a SOI (silicon-on-insulator). The semiconductor substrate 220 may be a silicon substrate or may include other substances, for example, silicon germanium, indium antimonide, lead tellurium compounds, indium arsenic, indium phosphide, gallium arsenide or gallium antimonide. Alternatively, the semiconductor substrate 220 may have an epitaxial layer formed on a base substrate. The semiconductor substrate 220 may include a first side SF1 and a second side SF2. The first side SF1 of the semiconductor substrate 220 may be opposite the second side SF2 of the semiconductor substrate 220. In some embodiments, the second side SF2 of the semiconductor substrate 220 may be a lightreceiving surface on which light may be incident. Also, the first side SF1 may be a front side of the semiconductor substrate 220, and the second side SF2 may be a back side of the semiconductor substrate 220.

In some embodiments, the transistor TR may be disposed at the first side SF1 of the semiconductor substrate 220. The transistor TR may be implemented with various configurations and may include one or more different transistors. For example, the transistor TR may include one or more of a transfer transistor, a reset transistor, a source follower transistor, or a selection transistor. The transistor TR may form the unit pixel of the image sensor.

The transistor TR may include a gate insulating film 222, a gate electrode 223, and an impurity implantation region 224. The gate insulating film 222 may be formed along a trench formed in the semiconductor substrate 220. The gate electrode 223 may fill a region defined by the gate insulating film 222. The gate electrode 223 may fill the trench formed in the semiconductor substrate 220. The impurity implantation region 224 may be formed by doping impurities into the semiconductor substrate 220. The gate electrode 223 may serve as a gate of the transistor TR, and the impurity implantation region 224 may serve as a source/drain of the transistor TR. Furthermore, the impurity implantation region 224 may correspond to, for example, a floating diffusion region.

The pixel isolation pattern 225 may be disposed in the semiconductor substrate 220. The pixel isolation pattern 225 may define a plurality of unit pixels. The unit pixels may be arranged two-dimensionally from a planar viewpoint. For example, the pixel isolation pattern 225 may be formed in a grid pattern from the planar viewpoint. In the planar viewpoint, the unit pixels may be separate from each other. The pixel isolation pattern 225 may be formed by burying an insulating material into a deep trench formed by patterning the semiconductor substrate 220.

In some embodiments, the pixel isolation pattern 225 may include an insulating spacer film 226 and a conductive filling pattern 227. The insulating spacer film 226 may extend conformally along side surfaces of the trench inside the semiconductor substrate 220. The conductive filling pattern 227 may be formed on the insulating spacer film 226 to, at least, partially fill the trench inside the semiconductor substrate 220.

The cyan pixel PC may include a first photoelectric conversion layer PD1. The first photoelectric conversion layer PD1 may be formed inside the semiconductor substrate 220. The semiconductor substrate 220 may completely surround the first photoelectric conversion layer PD1. The first photoelectric conversion layer PD1 may generate electric charges in proportion to an amount of light that is incident on the first photoelectric conversion layer PD1 from the outside. The first photoelectric conversion layer PD1 may be formed by doping impurities into the semiconductor substrate 220. For example, if the semiconductor substrate 220 is doped with p-type impurities, the first photoelectric conversion layer PD1 may be doped with n-type impurities. That is, the type of impurity with which the semiconductor substrate 220 is doped may be different from the type of impurity with which the first photoelectric conversion layer PD1 is doped.

In some embodiments, each pixel may include a surface insulating layer 210, a grid pattern 250, a liner 253, a color filter, and a microlens 254. For example, the cyan pixel PC may include a cyan color filter CF_C.

Also, the magenta pixel PM may include a magenta color filter CF_M, the yellow pixel PY may include a yellow color filter CF_Y, and the white pixel PW may not include a separate color filter. That is, although each pixel may include a different color filter, embodiments of the present invention are not limited thereto.

The surface insulating layer 210 may be stacked on the second side SF2 of the semiconductor substrate 220. The grid pattern 250, the liner 253, the color filter CF and the microlens 254 may be disposed in the region defined by the surface insulating layer 210.

The grid pattern 250 may correspond to the pixel isolation pattern 225. That is, the grid pattern 250 may be formed on the surface insulating layer 210 in the form of a grid from a planar viewpoint. For example, the grid pattern 250 may define a unit pixel. That is, the grid pattern 250 may be formed at the boundaries of pixels. Also, the grid pattern 250 may be formed between the color filters.

The grid pattern 250 may include, for example, a metal pattern 251 and a low refractive index pattern 252. The metal pattern 251 and the low refractive index pattern 252 may be sequentially stacked on the surface insulating layer 210. The liner 253 may be formed on the surface insulating layer 210 and the grid pattern 250. The liner 253 may extend along the surfaces of the surface insulating layer 210 and the grid pattern 250. The liner 253 may include, for example, but is not limited to, aluminum oxide.

Color filters may be formed in a region defined by the grid pattern 250. That is, the color filters may be formed on the liner 253 of the region defined as pixels. The cyan color filter CF_C may be formed in a region defined by the grid pattern 250 on the first photoelectric conversion layer PD1. The cyan color filter CF_C may be formed to partially cover the grid pattern 250. The magenta color filter CF_M may be formed in a region defined by the grid pattern 250 on the second photoelectric conversion layer PD2. The magenta color filter CF_M may be formed to partially cover the grid pattern 250. The yellow color filter CF_Y may be formed in a region defined by the grid pattern 250 on the third photoelectric conversion layer PD3. The yellow color filter CF_Y may be formed to partially cover the grid pattern 250. At a portion of the grid pattern 250 on the fourth photoelectric conversion layer PD4, a color filter may be omitted.

A microlens, such as the microlens 254, may be formed on each of the color filters. As shown in FIG. 4, the microlens 254 may be formed in the region defined by the grid pattern 250 on the fourth photoelectric conversion layer PD4 for the white pixels PW. The microlens may be arranged to correspond to each pixel. Each microlens, including the microlens 254, has a convex shape, and may have a predetermined radius of curvature. Accordingly, the microlenses may condense light incident on the first to fourth photoelectric conversion layers PD1, PD2, PD3, and PD4. For example, microlens 254 may condense light incident on the fourth photoelectric conversion layer PD4. The microlens 254 may include, for example, but is not limited to, a light transmissive resin. Here, the microlens of each pixel may cover one side of each pixel.

In some embodiments, a pixel, such as the cyan pixel PC, may include an inter-wiring insulating layer 230, a connecting structure, and the like. The connecting structure may be formed inside the inter-wiring insulating layer 230. Here, the connecting structure may include a plurality of metal layers MTL, a plurality of contacts C1 and C2, and the like. The pixel PX and the image sensor 100 may be electrically connected through the connecting structure.

Figure 5:
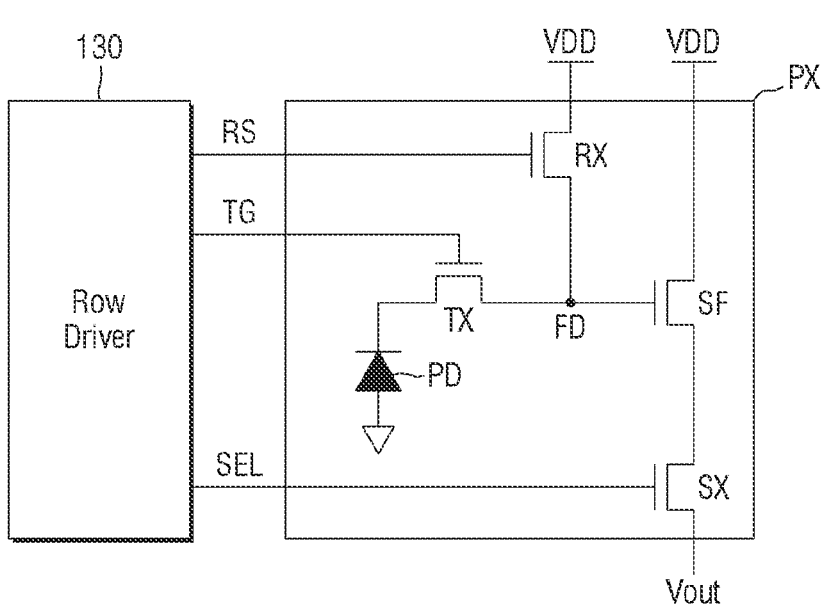
FIG. 5 is a circuit diagram for explaining a unit pixel of an image sensor according to some embodiments of the present disclosure.

FIG. 5 is a circuit diagram for explaining a unit pixel of an image sensor according to some embodiments.

Referring to FIG. 5, the unit pixel PX may include a photoelectric conversion layer PD, a transfer transistor TX, a reset transistor RX, a source follower SF, and a selection transistor SX. The unit pixel PX may be a unit that forms the pixel array 140 of FIG. 1 or the pixel array region (Pixel Array) of FIG. 2.

The transfer transistor TX may be connected between a photoelectric conversion layer PD and a floating diffusion region FD. For example, one end of the transfer transistor TX may be connected to the photoelectric conversion layer PD, and the other end thereof may be connected to the floating diffusion region FD. A control electrode of the transfer transistor TX may receive a first control signal TG.

The reset transistor RX may be connected between a power supply voltage VDD and the floating diffusion region FD. For example, one end of the reset transistor RX may receive the power supply voltage VDD, and the other end thereof may be connected to the floating diffusion region FD. A control electrode of the reset transistor RX may receive a control signal RS.

The source follower SF may be connected between the power supply voltage VDD and the selection transistor SX. For example, one end of the source follower SF may receive the power supply voltage VDD, and the other end thereof may be connected to one end of the selection transistor SX. A control electrode of the source follower SF may be connected to the floating diffusion region FD.

The selection transistor SX may be connected between the source follower SF and a column line CL (not shown). For example, one end of the selection transistor SX may be connected to the source follower SF, and the other end of the selection transistor SX is connected to the column line CL (not shown). A control electrode of the selection transistor SX may receive the control signal SEL.

The first control signal TG, a second control signal RS, and a third control signal SEL may be output from the row driver 130. The first control signal TG may control the transfer transistor TX. The second control signal RS may control the reset transistor RX. The third control signal SEL may control the selection transistor SX.

An output signal Vout of the selection transistor SX may be supplied to the column line. The output signal Vout may correspond to an analog signal. That is, the output signal Vout, output from the unit pixel PX, may be switched into a digital signal through the readout circuit 150. The digital signal may be sent to the image signal processor 900 as the image signal IMS.

Figure 6:
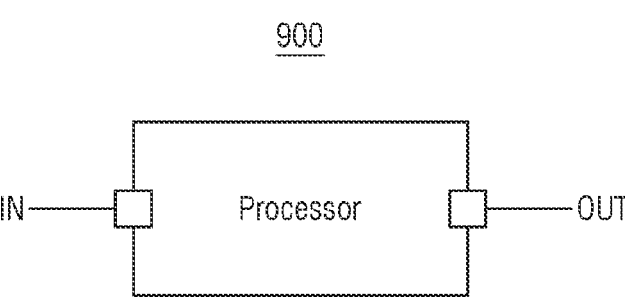
FIG. 6 is a diagram for explaining an image signal processor according to some embodiments of the present disclosure.

FIG. 6 is a diagram for explaining an image signal processor according to some embodiments.

As shown in FIG. 6, the image signal processor 900 may include an input unit IN and an output unit OUT.

Referring to FIG. 1 and FIG. 6, the image signal processor 900 according to some embodiments may receive the image signal IMS. The image signal IMS may be a row image signal generated by the image sensor 100, and may be generated based on data sensed by the unit pixel PX of FIG. 4, as an example.

Referring to FIG. 4, FIG. 5, and FIG. 6, the image signal IMS received by the image signal processor 900 are described below as being generated using the data sensed by the unit pixel PX of FIG. 4.

The input unit IN of the image signal processor 900 receives the image signal IMS. The image signal processor 900 may correct the image signal IMS received through the input unit IN, by the use of a color correction matrix. The color correction matrix (hereinafter referred to as CCM) may be set as in <Formula 1> below.

9

Formula 1 may be expressed as:

$$\begin{bmatrix} C' \\ M' \\ Y' \\ W' \end{bmatrix} = \begin{bmatrix} -1 & 0 & 0 & 1 \\ 0 & -1 & 0 & 1 \\ 0 & 0 & -1 & 1 \\ 1 & 1 & 1 & -2 \end{bmatrix} \cdot \begin{bmatrix} C \\ M \\ Y \\ W \end{bmatrix}$$

In Formula 1, $$\begin{bmatrix} C \\ M \\ Y \\ W \end{bmatrix}$$

is CMYW data sensed at the unit pixel PX of FIG. 4, and $$\begin{bmatrix} C' \\ M' \\ Y' \\ W' \end{bmatrix}$$

represents corrected CMYW data.

When summarizing Formula 1, the corrected CMYW may be expressed as <Formula 2> to <Formula 5>.

Formula 2 may be expressed as:

$$C' = -C + W = R$$

That is, the image signal processor 900 may correct an image signal generated by the cyan pixel PC and the white pixel PW using the color correction matrix, and extract an R data component from the corrected signal.

Formula 3 may be expressed as:

$$M' = -M + W = G$$

That is, the image signal processor 900 may correct image signals generated by the magenta pixel PM and the white pixel PW using a color correction matrix, and extract a G data component from the corrected signal.

Formula 4 may be expressed as:

$$Y' = -Y + W = B$$

That is, the image signal processor 900 may correct image signals generated by the yellow pixel PY and the white pixel PW using the color correction matrix, and extract a B data component from the corrected signals.

Formula 5 may be expressed as:

$$W' = C + M + Y - 2W = IR$$

That is, the image signal processor 900 may correct the image signals generated by the cyan pixel PC, the magenta pixel PM, the yellow pixel PY, and the white pixel PW using the color correction matrix, and extract the IR data component from the corrected image signals. The image signals may include a cyan signal component generated by the cyan pixel PC, a magenta signal component generated by the magenta pixel PM, a yellow signal component generated by the yellow pixel PY, and a white signal component generated by the white pixel PW. Also, the IR data component may be data sensed from an IR component of light that has been transmitted through the first pass filter 261 of the lens module 260 shown in FIG. 4.

<Formula 1> may be restated as <Formula 6>, which may be expressed as:

$$\begin{bmatrix} R \\ G \\ B \\ IR \end{bmatrix} = \begin{bmatrix} -1 & 0 & 0 & 1 \\ 0 & -1 & 0 & 1 \\ 0 & 0 & -1 & 1 \\ 1 & 1 & 1 & -2 \end{bmatrix} \cdot \begin{bmatrix} C \\ M \\ Y \\ W \end{bmatrix}$$

Referring to <Formula 6>, the image signal processor 900 may receive the image signal IMS through the input unit IN, and the image signal IMS may be generated based on the unit pixel PX of FIG. 4. Also, the image signal processor 900 may extract the image signal corrected by data $$\begin{bmatrix} R \\ G \\ B \\ IR \end{bmatrix}$$

through the corresponding image signal IMS using the color correction matrix (hereinafter, CCM).

The output unit OUT of the image signal processor 900 outputs a corrected image signal.

Figure 7:
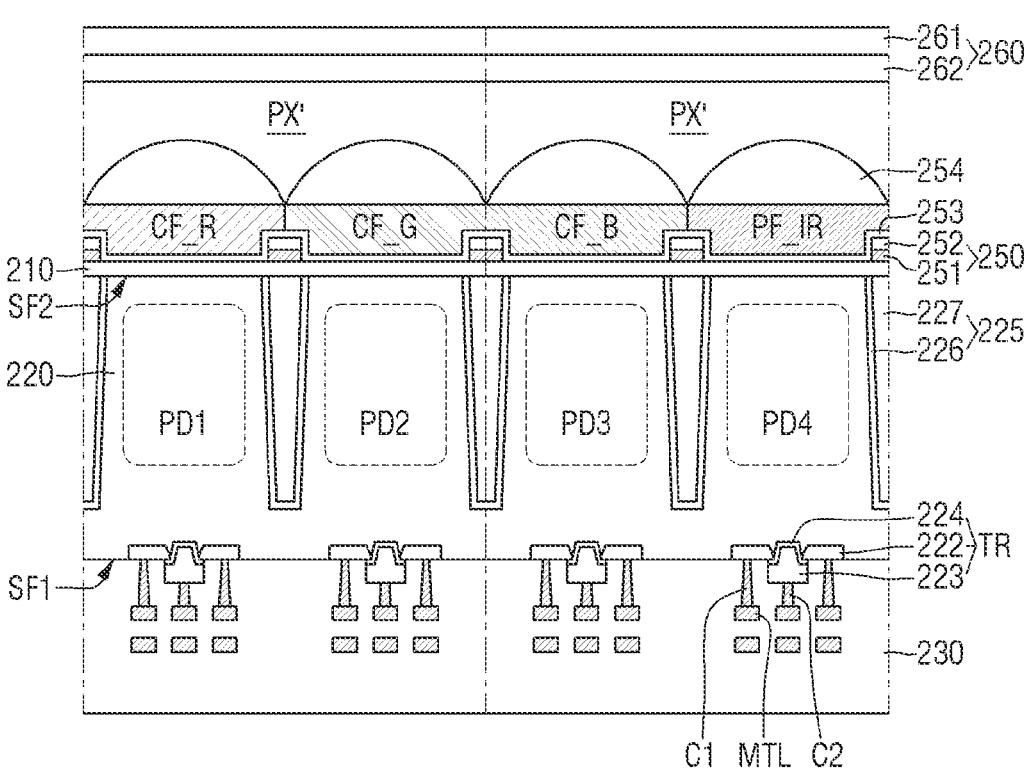
FIG. 7 is a diagram showing unit pixels placed in an RGB+IR pattern.

FIG. 7 is a diagram showing unit pixels arranged in an RGB+IR pattern. For convenience of explanation, repeated parts of contents explained using FIG. 1, FIG. 2, FIG. 3, FIG. 4, FIG. 5, and FIG. 6 may be briefly explained or omitted.

Referring to FIG. 1, FIG. 2, and FIG. 7, an image sensor 100 according to some embodiments may include a pixel array region (Pixel Array) having a unit pixel PX' pattern of FIG. 7.

Further, as described with reference to FIG. 4, FIG. 5, and FIG. 6, in some embodiments, an image sensor including unit pixels PX of CMYW pattern may achieve performance similar to, or the same as, as the image sensor including unit pixels PX' of RGB+IR pattern. For example, the image sensor including the unit pixel PX' of the RGB+IR pattern may generate the image signal IMS using light of the near-infrared (IR) range instead of light of the visible wavelength range in a low-illumination state with little or no light. Also, an image sensor including the unit pixel PX of the CMYW pattern may also generate the image signal IMS, using light of the near-infrared (IR) wavelength range instead of light of the visible wavelength range in the low-illuminance state with little or no light. An image sensor including a unit pixel of CMYW pattern (PX, shown in FIG. 4) may generate the image signal IMS using light of the near-infrared IR wavelength range without a separate IR pass filter PF_IR.

Further, referring to FIG. 6 and <Formula 6>, in the color correction matrix CCM set for correcting the image signal IMS generated based on the unit pixel PX of the CMYW pattern, off-diagonal elements of the color correction matrix CCM may be reduced as compared to the unit pixel of other patterns. Therefore, the image signal IMS generated based on the pixels of the CMYW pattern may have an improved signal-to-noise ratio as compared to other image signals generated based on the pixels of any pattern.

Figure 8:
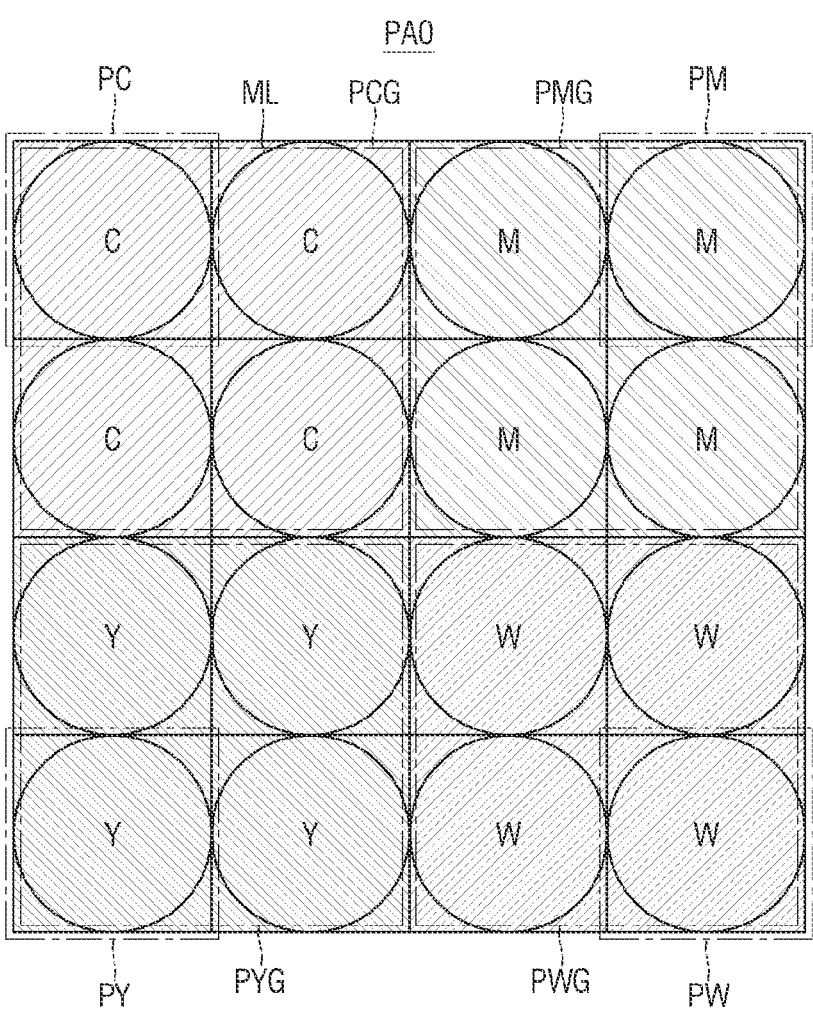
FIG. 8 is a diagram for explaining a pixel array according to some embodiments of the present disclosure.
Figure 9:
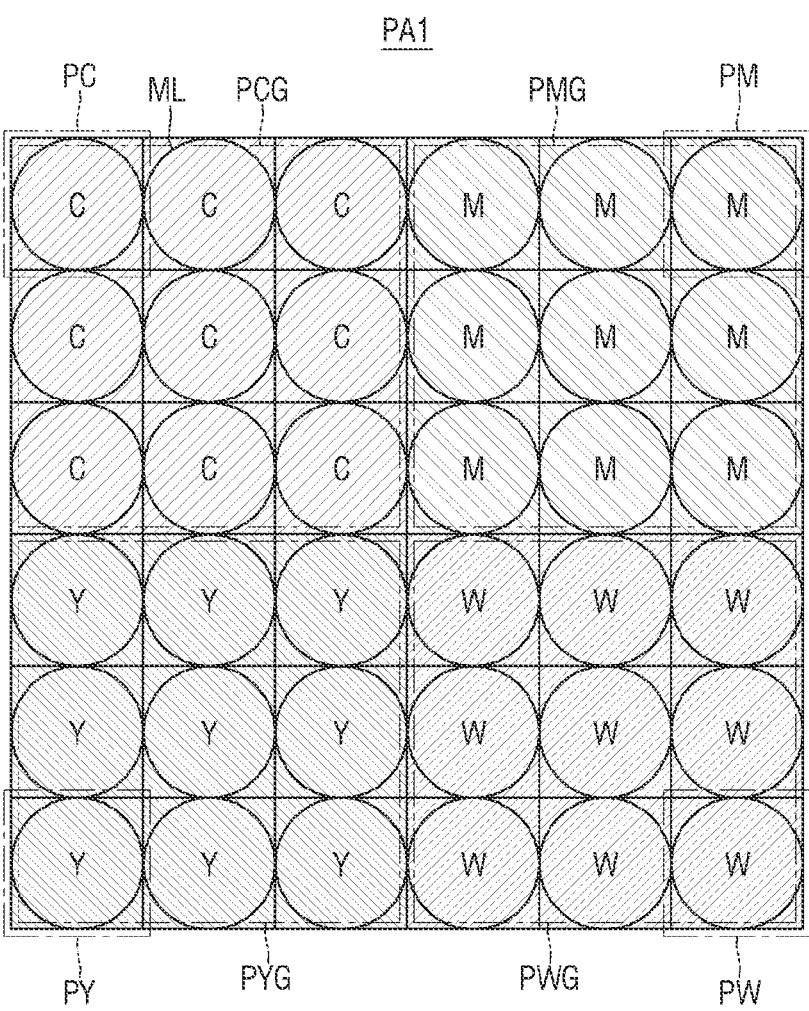
FIG. 9 is a diagram for explaining a pixel array according to some embodiments of the present disclosure.
Figure 10:
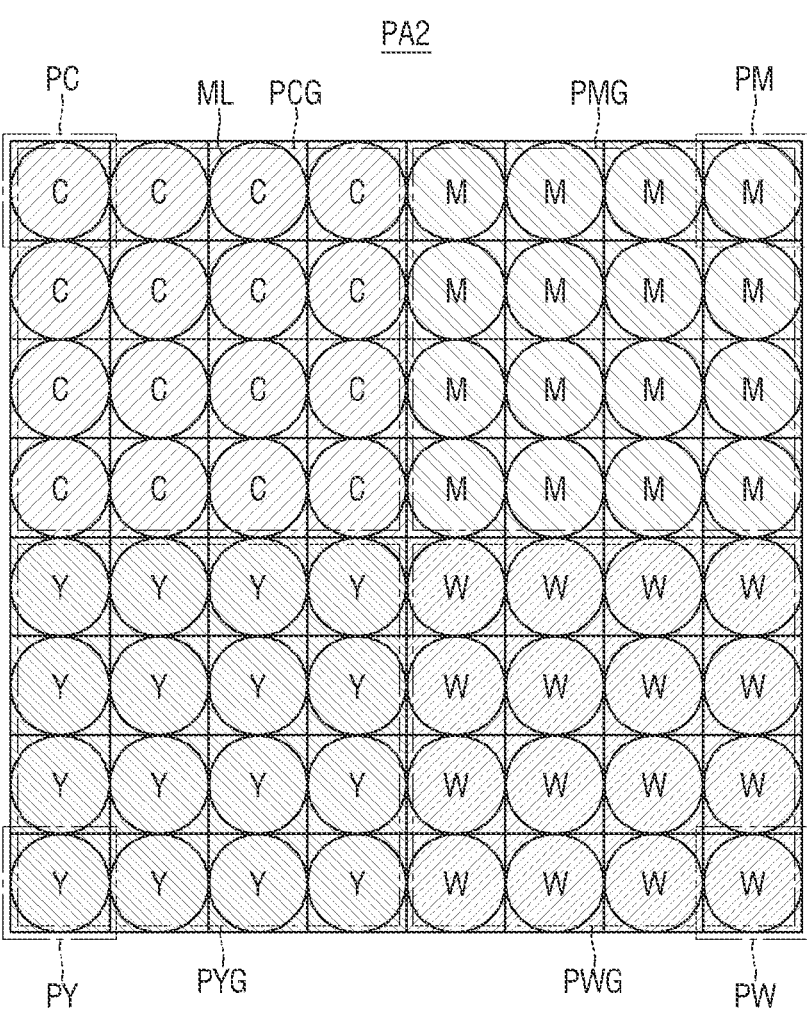
FIG. 10 is a diagram for explaining a pixel array according to some embodiments of the present disclosure.

FIG. 8 is a diagram for explaining a pixel array according to some embodiments. FIG. 9 is a diagram for explaining a pixel array according to some embodiments. FIG. 10 is a diagram for explaining a pixel array according to some embodiments. Repeated parts of contents explained using FIG. 1, FIG. 2, FIG. 3, FIG. 4, FIG. 5, FIG. 6, and FIG. 7 may be briefly described or omitted.

Referring to FIG. 8, a unit pixel group array PA0 according to some embodiments may include a plurality of sub-pixel groups (PCG, PMG, PWG, and PWG) arranged in a CMYW pattern. A unit pixel group may include colors of sub-pixel groups, for example, a cyan sub-pixel group, a magenta sub-pixel group, a yellow sub-pixel group, and a white sub-pixel group.

According to some embodiments, each sub-pixel group may include sub-pixels PC, PM, PY, or PW. For example, the cyan sub-pixel group PCG may include four sub-pixels PC. A plurality of sub-pixels PC, PM, PY and PW may be arranged two-dimensionally. For example, the plurality of sub-pixels PC, PM, PY and PW may be arranged in a matrix in the first direction and the second direction. The sub-pixels PC, PM, PY and PW may be arranged at regular intervals. A microlens ML may be disposed over each of the sub-pixels PC, PM, PY and PW.

The unit pixel group array PA0 may have sub-pixel groups arranged in a predetermined pattern. The sub-pixel groups of the unit pixel group array PA0 may have different configurations, which may depend on a number of sub-pixels per sub-pixel group. For example, in a case of four sub-pixels, the sub-pixel group may be called a tetra pixel (Tetra), in a case of nine sub-pixels, the sub-pixel group may be called a nona pixel (Nona), and in a case of sixteen sub-pixels, the sub-pixel group may be called a tetra 2 pixel (Tetra$^2$). Since the unit pixel group array PA0 includes four sub-pixels per sub-pixel group, each sub-pixel may be a tetra-pixel.

According to some embodiments, the unit pixel group array PA0 may be arranged in a Tetra pattern, while being in a CYMW pattern. For example, one sub-pixel group may be a pixel that may be defined as including 2×2 sub-pixels, i.e., four sub-pixels arranged in two rows and two columns. According to some embodiments, all the sub-pixel groups may include sub-pixels of a same color, or according to some embodiments, a sub-pixel group may include at least one sub-pixel of a different color, and the remaining pixels of the sub-pixel group may include sub-pixels of a same color.

For example, the unit pixel group array PA0 may include a cyan sub-pixel group PCG, a magenta sub-pixel group PMG, a yellow sub-pixel group PYG, and a white sub-pixel group PWG arranged in a first pattern. In the example of FIG. 8, each sub-pixel group may include four sub-pixels (i.e., tetra pixels).

Referring to FIG. 9, a unit pixel group array PA1 may include nine sub-pixels per sub-pixel group, and each sub-pixel may be a nona pixel.

According to some embodiments, the unit pixel group array PA1 may be arranged in a nona pattern, while being in a CYMW pattern. For example, one sub-pixel group may be a pixel that may be defined as including 3×3 sub-pixels, i.e., nine sub-pixels arranged in three rows and three columns. According to some embodiments, all the sub-pixel groups may include sub-pixels of a same color, or according to some embodiments, in a sub-pixel group may include at least one sub-pixel of a different color, and the remaining pixels of the sub-pixel group may include sub-pixels of a same color.

For example, the unit pixel group array PA1 may include a cyan sub-pixel group PCG, a magenta sub-pixel group PMG, a yellow sub-pixel group PYG, and a white sub-pixel group PWG arranged in a first pattern. In the example of FIG. 9, each sub-pixel group may include nine sub-pixels (i.e., nona pixels).

Referring to FIG. 10, a unit pixel group array PA2 may include sixteen sub-pixels per sub-pixel group, and each sub-pixel may be a tetra2 pixel.

According to some embodiments, the unit pixel group array PA2 may be arranged in a tetra2 pattern (Tetra2 pattern), while being in a CYMW pattern. For example, one sub-pixel group may be a pixel that may be defined as including 4×4 sub-pixels, i.e., sixteen sub-pixels arranged in four rows and four columns. According to some embodiments, all the sub-pixel groups may include sub-pixels of the same color, or according to some embodiments, in a sub-pixel group may include at least one sub-pixel of a different color, and the remaining pixels may include sub-pixels of a same color.

For example, the unit pixel group array PA2 may include a cyan sub-pixel group PCG, a magenta sub-pixel group PMG, a yellow sub-pixel group PYG, and a white sub-pixel group PWG arranged in the first pattern. In the example of FIG. 10, each sub-pixel group may include sixteen sub-pixels (i.e., tetra2 pixels).

Figure 11:
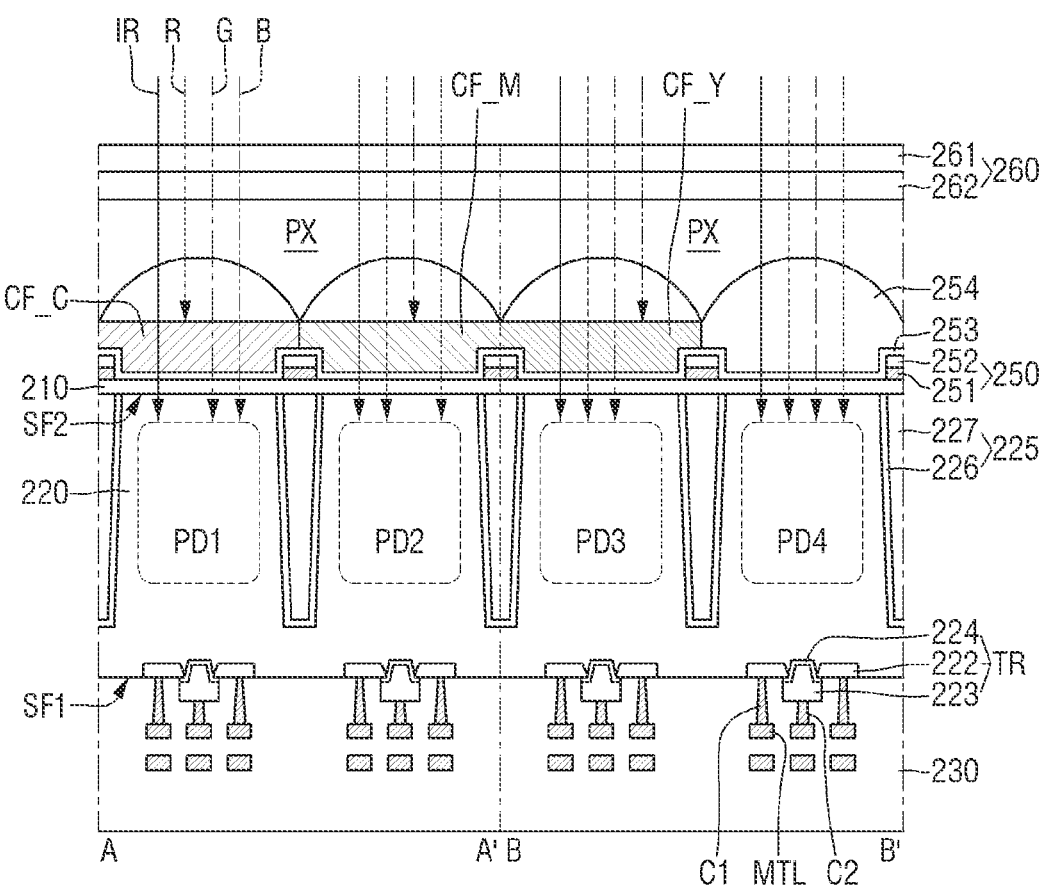
FIG. 11 is a diagram for explaining a method of processing the image signal according to some embodiments of the present disclosure.
Figure 12:
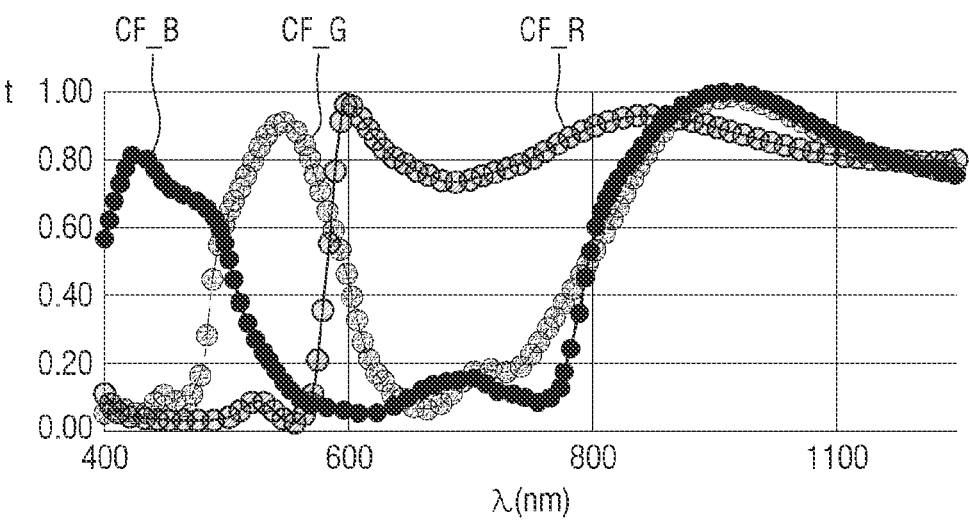
FIG. 12 is a diagram for explaining light transmittance according to the color filter in some embodiments of the present disclosure.
Figure 13:
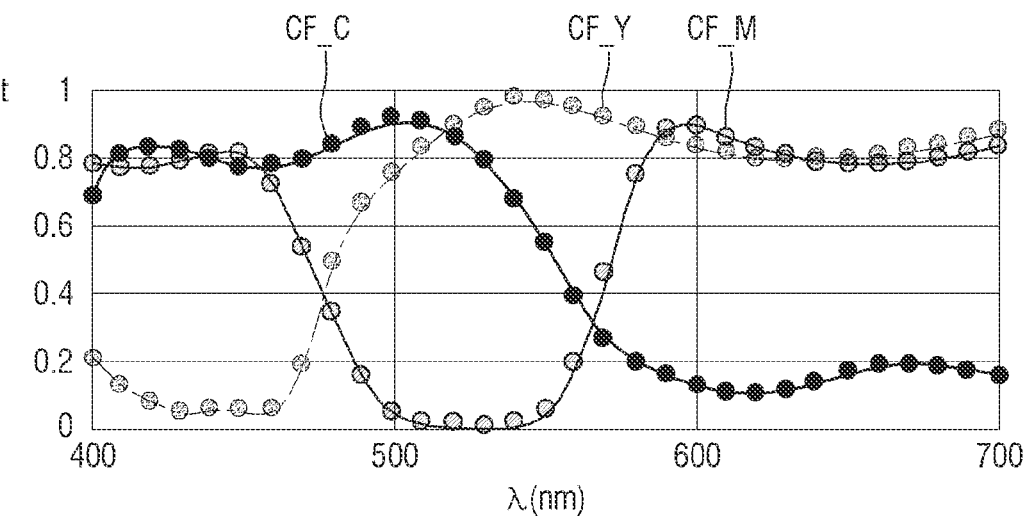
FIG. 13 is a diagram for explaining the light transmittance according to the color filter in some embodiment of the present disclosure.
Figure 14:
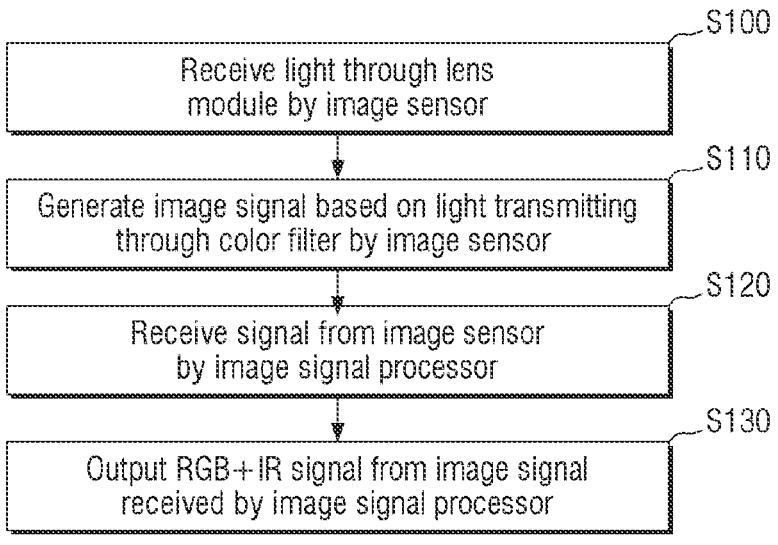
FIG. 14 is a flow chart for explaining a method of processing the image signal according to some embodiments of the present disclosure.

FIG. 11 is a diagram for explaining a method of processing an image signal according to some embodiments. FIG. 12 is a diagram for explaining light transmittance according to the color filter in some embodiments. FIG. 13 is a diagram for explaining the light transmittance according to the color filter in some embodiments. FIG. 14 is a flow chart for explaining a method of processing the image signal according to some embodiments.

Referring to FIG. 11, FIG. 12, and FIG. 13, in some embodiments, the cyan color filter CF_C may transmit light of the near-infrared (IR) range, the green (G) component of light, and the blue (B) component of light. Therefore, as shown in FIG. 13, a transmittance t for each wavelength λ band of the cyan color filter CF_C may have characteristics of transmittance t for each wavelength λ band of the green color filter CF_G and the blue color filter CF_B shown in FIG. 12. For example, as shown in FIG. 12, the wavelength λ range band of light with high transmittance t in the green color filter CF_G and the blue color filter CF_B may coincide with the wavelength λ range band of light with high transmittance t in the cyan color filter CF_C shown in FIG. 13.

Further, in some embodiments, the magenta color filter CF_M may transmit light of the near-infrared (IR) range, the red (R) component of light, and the blue (B) component of light. Therefore, as shown in FIG. 13, the transmittance t for each wavelength λ band of the magenta color filter CF_M may have characteristics of the transmittance t for each wavelength A band of the red filter CF_R and the blue color filter CF_B shown in FIG. 12. For example, as shown in FIG. 12, the wavelength λ range band of light with high transmittance t in the red color filter CF_R and the blue color filter CF_B may coincide with the wavelength λ range band of light with high transmittance t in the magenta color filter CF_M shown in FIG. 13.

Also, in some embodiments, the yellow color filter CF_Y may transmit light of the near-infrared (IR) range, the red (R) component of light, and the green (G) component of light. Therefore, as shown in FIG. 13, the transmittance t for each wavelength λ band of the yellow color filter CF_Y may have characteristics of the transmittance t for each wavelength λ band of the red filter CF_R and the green color filter CF_G shown in FIG. 12. For example, as shown in FIG. 12, the wavelength λ range band of light with high transmittance t in the red color filter CF_R and the green color filter CF_G may coincide with the wavelength λ range band of light with high transmittance t in the yellow color filter CF_Y shown in FIG. 13.

Although not shown in FIG. 13, as described above, the cyan color filter CF_C may have characteristics of the green color filter CF_G and the blue color filter CF_B, the magenta color filter CF_M has characteristics of the red color filter CF_R and the blue color filter CF_B, and the yellow color filter CF_Y has characteristics of the red color filter CF_R and the green color filter CF_G. Accordingly, as shown in FIG. 12, the cyan color filter CF_C, the magenta color filter CF_M, and the yellow color filter CF_Y may have a high transmittance t for light of the wavelength λ range band of about 800 nm to about 1100 nm. For example, the light of that wavelength λ range band may be light in the near-infrared (IR) range.

Referring to FIG. 1 and FIG. 14, the image sensor 100 may include a pixel array 140 having unit pixels PX arranged in a CMYW pattern. As shown in FIG. 11 and FIG. 14, the image sensor 100 may receive light through the lens module 260 (S100). The light received through the lens module 260 may include light of the visible ray range and light in the near-infrared (IR) range.

The image sensor 100 may generate image signals on the basis of the light transmitted through the color filters CF (S110). For example, the image sensor 100 may generate a first image signal based on the green (G) component and the blue (B) component of the light, and light component of the near-infrared (IR) range that are transmitted through the cyan color filter CF_C. In addition, the image sensor 100 may generate a second image signal based on the red (R) component and the blue (B) component of the light, and light component of the near-infrared (IR) range that are transmitted through the magenta color filter CF_M. In addition, the image sensor 100 may generate a third image signal based on the red (R) component and the green (G) component of the light, and the light component of the near-infrared (IR) range that are transmitted through the yellow color filter CF_Y. Also, the image sensor 100 may generate a fourth image signal based on the light transmitted through the lens module 260 only for the white pixel PW with no color filter CF.

The image signal processor 900 may receive the first image signal, the second image signal, the third image signal, and the fourth image signal from the image sensor 100 (S120). In some embodiments, the image signal processor 900 may include an input unit IN and an output unit OUT, as shown in FIG. 6.

The image signal processor 900 may output signals corrected through the color correction process on the received image signals (e.g., the first image signal, the second image signal, the third image signal, and the fourth image signal) (S130). Moreover, the corrected signal may have a similar or the same performance as the signal that is output from the image sensor arranged in the pixels of the RGB+IR pattern.

Figure 15:
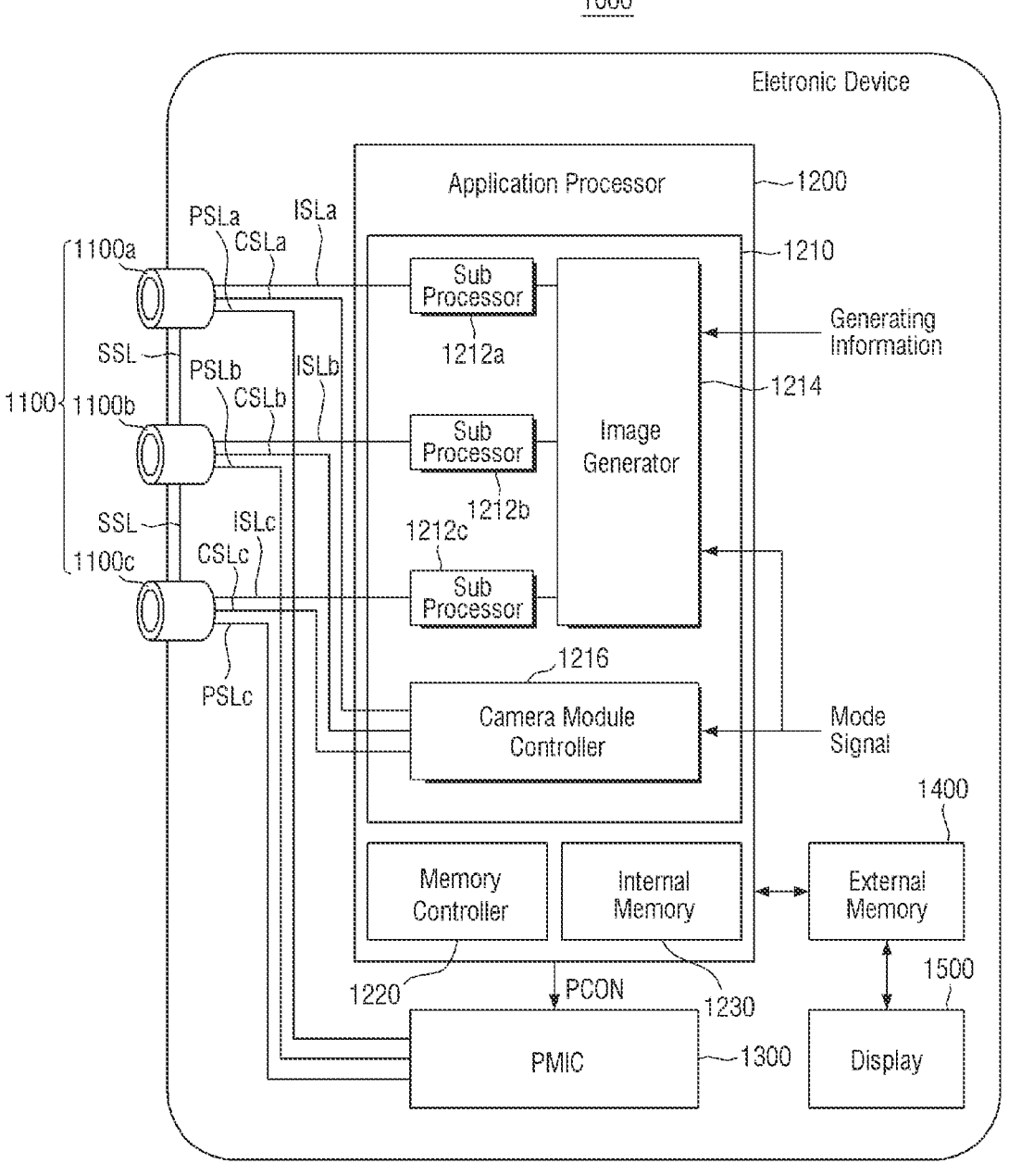
FIG. 15 is a block diagram of an electronic device including a multi-camera module.
Figure 16:
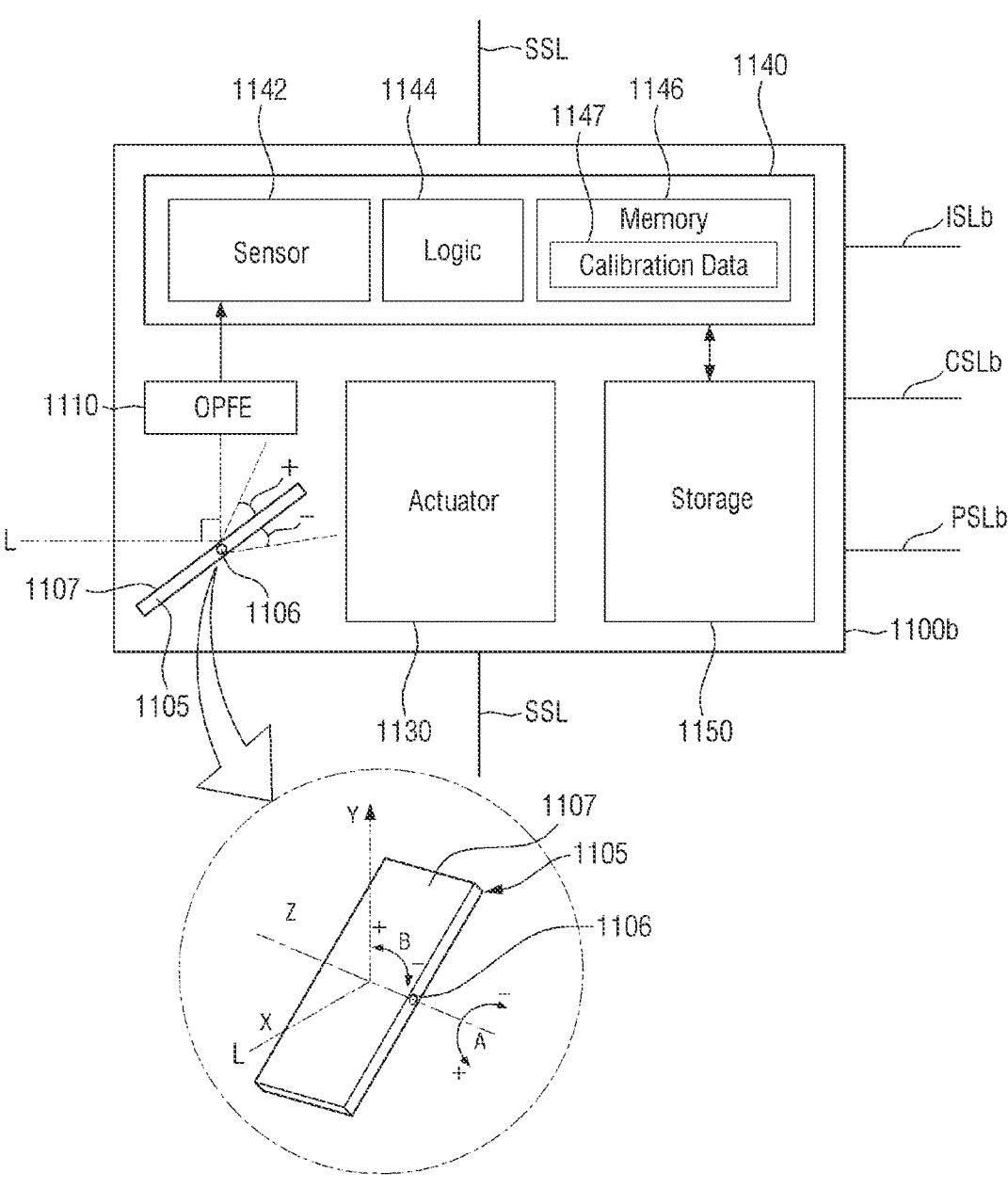
FIG. 16 is a detailed block diagram of the camera module of FIG. 15.

FIG. 15 is a block diagram of an electronic device including a multi-camera module. FIG. 16 is a detailed block diagram of the multi-camera module of FIG. 15.

Referring to FIG. 15, the electronic device 1000 may include a camera module group 1100, an application processor 1200, a power management integrated circuit (PMIC) 1300, an external storage 1400, and a display 1500.

The camera module group 1100 may include a plurality of camera modules 1100a, 1100b, and 1100c. While some of the drawing show an embodiment including the three camera modules 1100a, 1100b, and 1100c, embodiments are not limited thereto. In some embodiments, the camera module group 1100 may be modified to include two camera modules. Also, in some embodiments, the camera module group 1100 may be modified to include n (n is a natural number equal to or greater than 4) camera modules.

One of the three camera modules 1100a, 1100b, and 1100c may include the image sensor 100 described using FIGS. 1 to 14. That is, the image sensor 100 of the camera modules 1100a, 1100b, and 1100c may include a pixel array region (e.g., Pixel Array) having a unit pixel PX, a unit pixel array group PA1 or a unit pixel array group PA2.

Hereinafter, although a detailed configuration of the camera module 1100b are described in more detail referring to FIG. 16, the following description may be applied to the other camera modules 1100a and 1100c depending on an embodiment.

Referring to FIG. 16, the camera module 1100b may include a prism 1105, an optical path folding element (hereinafter, "OPFE") 1110, an actuator 1130, an image sensing device 1140, and storage 1150.

The prism 1105 may include a reflecting surface 1107 made of a light-reflecting material. The prism 1105 may change the path of light L that is incident from the outside.

In some embodiments, the prism 1105 may change the path of light L incident in the first direction X to a second direction Y, which may be perpendicular to the first direction X. Further, the prism 1105 may rotate the reflecting surface 1107 of the light-reflecting material in an A-direction around a central axis 1106 or rotate the central axis 1106 in a B-direction to change the path of the light L incident in the first direction X into the vertical second direction Y. The OPFE 1110 may also move in a third direction Z that may be perpendicular to the first direction X and the second direction Y.

In some embodiments, as shown, although a maximum rotation angle of the prism 1105 in the A-direction may be equal to or less than about 15 degrees in a positive (+) A-direction, and may be greater than about 15 degrees in a negative (−) A-direction, embodiments are not limited thereto.

In some embodiments, the prism 1105 may move by about 20 degrees, or between about 10 and about 20 degrees, or between about 15 and about 20 degrees in the positive (+) or negative (−) B-direction. Here, the prism 1105 may move at a same angle in the positive (+) or negative (−) B-direction, or may move at about the same angle within the range of about 1 degree.

In some embodiments, the prism 1105 may move the reflecting surface 1107 of the light-reflecting material in the third direction (e.g., a Z-direction) parallel to an extension direction of the central axis 1106.

The OPFE 1110 may include, for example, an optical lens including m (here, m is a natural number) groups. The m lenses may move in the second direction Y to change an optical zoom ratio of the camera module 1100b. For example, when an optical zoom ratio of the camera module 1100b is set as Z, if the m optical lenses included in the OPFE 1110 are moved, the optical zoom ratio of the camera module 1100b may be changed to the optical zoom ratio of 3Z or 5Z or higher.

The actuator 1130 may move the OPFE 1110 or an optical lens (hereinafter, referred to as an optical lens) to a specific position. For example, the actuator 1130 may adjust the position of the optical lens so that an image sensor 1142 may be located at a focal length of the optical lens for accurate sensing.

The image sensing device 1140 may include an image sensor 1142, control logic 1144, and a memory 1146. The image sensor 1142 may sense an image, using light L provided through the optical lens. The control logic 1144 may control the overall operation of the camera module 1100*b*. For example, the control logic 1144 may control the operation of the camera module 1100*b* in accordance with the control signal provided through a control signal line CSLb.

The memory 1146 may store information that may be used for the operation of the camera module 1100*b* such as calibration data 1147. The calibration data 1147 may include information that may be used for the camera module 1100*b* to generate image data, using the light L provided from the outside. The calibration data 1147 may include, for example, information on the degree of rotation, information on the focal length, information on the optical axis explained above, and the like. When the camera module 1100*b* is implemented in the form of a multi-state camera whose focal length may be changed depending on the position of the optical lens, the calibration data 1147 may include information about the focal length values for each position (or for each state) of the optical lens and auto focusing.

The storage 1150 may store the image data sensed through the image sensor 1142. The storage 1150 may be outside the image sensing device 1140. The storage 1150 may be stacked with sensor chips constituting the image sensing device 1140. In some embodiments, although the storage 1150 may be implemented as an EEPROM (Electrically Erasable Programmable Read-Only Memory), embodiments are not limited thereto.

Referring to FIG. 15 and FIG. 16 together, in some embodiments, each of the plurality of camera modules 1100*a*, 1100*b*, and 1100*c* may include an actuator 1130. Accordingly, each of the plurality of camera modules 1100*a*, 1100*b*, and 1100*c* may include calibration data 1147. The calibration data 1147 may the same, or different, according to the operation of the actuator 1130 included in the camera module.

In some embodiments, one camera module (e.g., 1100*b*) among the plurality of camera modules 1100*a*, 1100*b*, and 1100*c* may be a folded lens type camera module including the prism 1105 and the OPFE 1110 described above, and the remaining camera modules (e.g., 1100*a* and 1100*c*) may be vertical camera modules. The vertical camera modules may not include the prism 1105 and the OPFE 1110. However, embodiments are not limited thereto.

In some embodiments, one camera module (e.g., 1100*c*) among the plurality of camera modules 1100*a*, 1100*b*, and 1100*c* may be a vertical depth camera that extracts depth information, for example, using an IR (Infrared Ray). In this case, the application processor 1200 may merge the image data provided from such a depth camera with the image data provided from another camera module (e.g., 1100*a* or 1100*b*) to generate a three-dimensional (3D) depth image.

In some embodiments, at least two camera modules (e.g., 1100*a* and 1100*b*) among the plurality of camera modules 1100*a*, 1100*b*, and 1100*c* may have fields of view different from each other. In this case, for example, although the optical lenses of at least two camera modules (e.g., 1100*a* and 1100*b*) among the plurality of camera modules 1100*a*, 1100*b*, and 1100*c* may be different from each other, embodiments are not limited thereto.

In some embodiments, viewing angles of each of the plurality of camera modules 1100*a*, 1100*b*, and 1100*c* may be different from each other. In this case, although the optical lenses included in each of the plurality of camera modules 1100*a*, 1100*b*, and 1100*c* may be different from each other, embodiments are not limited thereto.

In some embodiments, each of the plurality of camera modules 1100*a*, 1100*b*, and 1100*c* may be physically separated from each other. That is, a sensing region of one image sensor, such as the image sensor 1142, may not be used separately by the plurality of camera modules 1100*a*, 1100*b*, and 1100*c*, and independent image sensors may be inside each of the plurality of camera modules 1100*a*, 1100*b*, and 1100*c*.

Referring to FIG. 15 again, the application processor 1200 may include an image processing device 1210, a memory controller 1220, and a memory 1230, such as an internal memory. The application processor 1200 may be implemented separately from the plurality of camera modules 1100*a*, 1100*b*, and 1100*c*. For example, the application processor 1200 and the plurality of camera modules 1100*a*, 1100*b*, and 1100*c* may be implemented separately as separate semiconductor chips.

The image processing device 1210 may include a plurality of sub-image processors 1212*a*, 1212*b*, and 1212*c*, an image generator 1214, and a camera module controller 1216.

The image processing device 1210 may include a plurality of sub-image processors 1212*a*, 1212*b*, and 1212*c* corresponding to the number of the plurality of camera modules 1100*a*, 1100*b*, and 1100*c*. Further, in some embodiments, each of the sub-image processors 1212*a*, 1212*b*, and 1212*c* may be an instance of the image signal processor 900 shown in FIG. 1 and FIG. 6.

Image data generated from each of the camera modules 1100*a*, 1100*b*, and 1100*c* may be provided to the corresponding sub-image processors 1212*a*, 1212*b*, and 1212*c* through image signal lines ISLa, ISLb, and ISLc, which may be separated from each other. For example, the image data generated from the camera module 1100*a* may be provided to the sub-image processor 1212*a* through an image signal line ISLa, the image data generated from the camera module 1100*b* may be provided to the sub-image processor 1212*b* through an image signal line ISLb, and the image data generated from the camera module 1100*c* may be provided to the sub-image processor 1212*c* through an image signal line ISLc. Although such an image data transmission may be performed using, for example, a camera serial interface (CSI) based on a mobile industry processor interface (MIPI), embodiments are not limited thereto.

On the other hand, in some embodiments, a single sub-image processor may correspond to a plurality of camera modules. For example, the sub-image processor 1212*a* and the sub-image processor 1212*c* may not be implemented separately from each other as shown, but may be implemented by being integrated as a single sub-image processor. The image data provided from the camera module 1100*a* and the camera module 1100*c* may be selected through a selection element (e.g., a multiplexer) or the like, and then provided to an integrated sub-image processor.

The image data provided to the respective sub-image processors 1212*a*, 1212*b*, and 1212*c* may be provided to the image generator 1214. The image generator 1214 may generate the output image, using the image data provided from the respective sub-image processors 1212*a*, 1212*b*, and 1212*c* according to the image generating information or the mode signal.

Specifically, the image generator 1214 may merge at least some of the image data generated from the camera modules 1100*a*, 1100*b*, and 1100*c* having different viewing angles to generate the output image, in accordance with the image generating information or the mode signal. Further, the image generator 1214 may select any one of the image data generated from the camera modules 1100*a*, 1100*b*, and 1100c having different viewing angles to generate the output image, in accordance with the image generating information or the mode signal.

In some embodiments, the image generating information may include a zoom signal (or a zoom factor). In some embodiments, the mode signal may be, for example, a signal based on the mode selected from a user.

When the image generating information is a zoom signal (a zoom factor) and each of the camera modules 1100a, 1100b, and 1100c has a field of view (e.g., a viewing angle) different from each other, the image generator 1214 may perform different operations depending on the type of zoom signals. For example, when the zoom signal is a first signal, the image data output from the camera module 1100a and the image data output from the camera module 1100c may be merged, and an output image may be generated using the merged image signal and the image data, which is not used for merging, output from the camera module 1100b. If the zoom signal is a second signal that is different from the first signal, the image generator 1214 may not merge the image data, and may select any one of the image data output from each of the camera modules 1100a, 1100b, and 1100c to generate the output image. Embodiments are not limited thereto, and a method of processing the image data may be modified as needed.

In some embodiments, the image generator 1214 may receive a plurality of image data with different exposure times from at least one of the plurality of sub-image processors 1212a, 1212b and 1212c, and perform high dynamic range (HDR) processing on the plurality of image data, thereby generating merged image data with an increased dynamic range.

The camera module controller 1216 may provide the control signal to each of the camera modules 1100a, 1100b, and 1100c. The control signals generated from the camera module controller 1216 may be provided to the corresponding camera modules 1100a, 1100b, and 1100c through the control signal lines CSLa, CSLb and CSLc separated from each other.

One of the camera modules 1100a, 1100b, and 1100c may be designated as a primary camera (e.g., camera module 1100a) depending on the image generating information including the zoom signal or the mode signal, and the remaining camera modules (e.g., 1100b and 1100c) may be designated as secondary cameras. This information may be included in the control signal, and may be provided to the corresponding camera modules 1100a, 1100b, and 1100c through the control signal lines CSLa, CSLb and CSLc separated from each other.

The camera modules that operate as primary and secondary may be changed depending on the zoom factor or the operating mode signal. For example, if the viewing angle of the camera module 1100a is wider than that of the camera module 1100b and the zoom factor exhibits a low zoom ratio, the camera module 1100b may operate as the primary camera, and the camera module 1100a may operate as the secondary camera. In contrast, when the zoom factor exhibits a high zoom ratio, the camera module 1100a may operate as the primary camera and the camera module 1100b may operate as the secondary camera.

In some embodiments, the control signals provided from the camera module controller 1216 to the respective camera modules 1100a, 1100b, and 1100c may include a sync enable signal. For example, if the camera module 1100b is the primary camera and the camera modules 1100a and 1100c are the secondary cameras, the camera module controller 1216 may transmit the sync enable signal to the camera module 1100b. The camera module 1100b, which receives the sync enable signal, generates a sync signal based on the received sync enable signal, and may provide the generated sync signal to the camera modules 1100a and 1100c through the sync signal line SSL. The camera module 1100b and the camera modules 1100a and 1100c may transmit the image data to the application processor 1200 in synchronization with such a sync signal.

In some embodiments, the control signals provided from the camera module controller 1216 to the plurality of camera modules 1100a, 1100b, and 1100c may include mode information according to the mode signal. On the basis of the mode information, the plurality of camera modules 1100a, 1100b, and 1100c may operate in a first operating mode and a second operating mode in connection with the sensing speed.

The plurality of camera modules 1100a, 1100b, and 1100c may generate an image signal at a first speed in the first operating mode (for example, generate an image signal of a first frame rate), encode the image signal at a second speed higher than the first speed (for example, encode an image signal of a second frame rate higher than the first frame rate), and transmit the encoded image signal to the application processor 1200. The second speed may be about 30 times or less of the first speed, for example.

The application processor 1200 may store the received image signal, which may be the encoded image signal, in the memory 1230 provided inside or at an external storage 1400 of the application processor 1200. The application processor 1200 may read and decode the encoded image signal from the memory 1230 or the external storage 1400. The application processor 1200 may display image data to be generated based on the decoded image signal. For example, the corresponding sub-image processors among the plurality of sub-image processors 1212a, 1212b, and 1212c of the image processing device 1210 may perform decoding, and may also perform the image processing on the decoded image signal.

A plurality of camera modules 1100a, 1100b, and 1100c may generate image signals at a third speed lower than the first speed in the second operating mode (for example, generate an image signal of a third frame rate lower than the first frame rate), and transmit the image signal to the application processor 1200. The image signal provided to the application processor 1200 may be a non-encoded signal. The application processor 1200 may perform the image processing on the received image signal or store the image signal in the memory 1230 or the external storage 1400.

The PMIC 1300 may supply a power, e.g., a power supply voltage, to each of the plurality of camera modules 1100a, 1100b, and 1100c. For example, the PMIC 1300 may supply a first power to the camera module 1100a through a power signal line PSLa, supply a second power to the camera module 1100b through a power signal line PSLb, and supply a third power to the camera module 1100c through a power signal line PSLc. The PMIC 1300 may supply power under the control of the application processor 1200.

The PMIC 1300 may generate power corresponding to each of the plurality of camera modules 1100a, 1100b, and 1100c and adjust the level of power, in response to a power control signal PCON from the application processor 1200. The power control signal PCON may include power adjustment signals for each operating mode of the plurality of camera modules 1100a, 1100b, and 1100c. For example, the operating mode may include a low power mode, and the power control signal PCON may include information about the camera module that operates in the low power mode and a power level to be set. The levels of powers provided to each of the plurality of camera modules 1100a, 1100b, and 1100c may be the same for each camera module, or different from each other. Also, the levels of powers may be changed dynamically.

Although embodiments of the present invention have been described above with reference to the accompanying drawings, the present invention is not limited to the above embodiments, and may be manufactured in various forms. Those skilled in the art will appreciate that the present invention may be embodied in other specific forms without changing the technical spirit or essential features of the present invention. Accordingly, the above-described embodiments are to be considered in all respects as illustrative and not restrictive.

The invention claimed is:

1. An image sensing device comprising:
a lens module;
a microlens below the lens module;
an image sensor below the microlens and comprising:
    a first pixel having a cyan color filter, and which receives light through the lens module and outputs a first image signal;
    a second pixel having a magenta color filter, and which receives light through the lens module and outputs a second image signal;
    a third pixel having a yellow color filter, and which receives light through the lens module and outputs a third image signal; and
    a fourth pixel which receives light through the lens module and outputs a fourth image signal; and
an image signal processor which receives a plurality of image signals including the first image signal, the second image signal, the third image signal and the fourth image signal, and extracts a red (R) data component, a green (G) data component, a blue (B) data component, and a near-infrared (IR) data component from the plurality of image signals,
wherein the image signal processor extracts the IR data component using the first image signal, the second image signal, the third image signal, and the fourth image signal.

2. The image sensing device of claim 1,
wherein the lens module comprises:
    a first pass filter which transmits light of an IR wavelength range; and
    a second pass filter which transmits light of a visible wavelength range.

3. The image sensing device of claim 2,
wherein the first pass filter is on the second pass filter.

4. The image sensing device of claim 1,
wherein the image signal processor extracts the R data component using the first image signal and the fourth image signal.

5. The image sensing device of claim 4,
wherein the R data component is extracted by subtracting the first image signal from the fourth image signal.

6. The image sensing device of claim 1,
wherein the image signal processor extracts the G data component using the second image signal and the fourth image signal.

7. The image sensing device of claim 6,
wherein the G data component is extracted by subtracting the second image signal from the fourth image signal.

8. The image sensing device of claim 1,
wherein the image signal processor extracts the B data component using the third image signal and the fourth image signal.

9. The image sensing device of claim 8,
wherein the B data component is extracted by subtracting the third image signal from the fourth image signal.

10. The image sensing device of claim 1,
wherein the IR data component is extracted by subtracting the fourth image signal twice from a result obtained by adding the first image signal, the second image signal, and the third image signal.

11. The image sensing device of claim 1, further comprising a liner on the image sensor, wherein the microlens is disposed directly on the liner in a region of the fourth pixel.

12. The image sensing device of claim 1,
wherein no color filter is disposed in a region of the fourth pixel.

13. The image sensing device of claim 1, wherein the image signal processor extracts the R data component, the G data component, the B data component, and the IR data component using a color correction matrix for correcting the plurality of image signals based on a pattern formed by an arrangement of the first pixel, the second pixel, the third pixel, and the fourth pixel.

14. An image sensing device comprising:
an image sensor configured to output, based on a received light, a first image signal including a cyan signal component, a second image signal including a magenta signal component, a third image signal including a yellow signal component, and a fourth image signal including a white signal component; and
an image signal processor configured to receive the first image signal, the second image signal, the third image signal, and the fourth image signal from the image sensor, and extract a red (R) data component, a green (G) data component, a blue (B) data component, and a near-infrared (IR) data component of the received light from the first image signal, the second image signal, the third image signal, and the fourth image signal,
wherein the R data component is extracted using the first image signal and the fourth image signal,
wherein the G data component is extracted using the second image signal and the fourth image signal,
wherein the B data component is extracted using the third image signal and the fourth image signal, and
wherein the IR data component is extracted using the first image signal, the second image signal, the third image signal, and the fourth image signal.

15. A method of processing an image signal, the method comprising:
filtering a first light through a lens module to obtain a second light;
generating, by an image sensor, a first image signal using a first portion of the second light received through a cyan color filter;
generating, by the image sensor a second image signal using a second portion of the second light received through a magenta color filter;
generating, by the image sensor, a third image signal using a third portion of the second light received through a yellow color filter;
generating, by the image sensor, a fourth image signal using the second light; and extracting, by an image signal processor, a red (R) data component, a green (G) data component, a blue (B) data component, and a near-infrared (IR) data component from the first image signal, the second image signal, the third image signal, and the fourth image signal, wherein the R data component is extracted using the first image signal and the fourth image signal, the G data component is extracted using the second image signal and the fourth image signal, the B data component is extracted using the third image signal and the fourth image signal, and the IR data component is extracted using the first image signal, the second image signal, the third image signal, and the fourth image signal.

16. The method of processing the image signal of claim 15, wherein filtering the first light through the lens module comprises:

transmitting light of an IR wavelength range through a first pass filter; and transmitting light of a visible wavelength range through a second pass filter, and wherein the transmitting of the light of the visible wavelength range is performed after the transmitting of the light of the IR wavelength range.

17. The method of processing the image signal of claim 16, wherein the R data component is extracted by subtracting the first image signal from the fourth image signal, the G data component is extracted by subtracting the second image signal from the fourth image signal, the B data component is extracted by subtracting the third image signal from the fourth image signal, and the IR data component is extracted by subtracting the fourth image signal twice, from a result obtained by adding the first image signal, the second image signal, and the third image signal.

\* \* \* \* \*